US 11,799,055 B2

United States Patent
Albert et al.

(10) Patent No.: US 11,799,055 B2
(45) Date of Patent: Oct. 24, 2023

(54) METHOD AND MANUFACTURING SYSTEM OF PRODUCING MICROELECTRONIC COMPONENTS WITH A LAYER STRUCTURE

(71) Applicant: 3D-Micromac AG, Chemnitz (DE)

(72) Inventors: Sven Albert, Penig (DE); René Boettcher, Mittweida (DE); Alexander Boehm, Marienberg (DE); Mike Lindner, Chemnitz (DE); Thomas Schmidt, Gera (DE)

(73) Assignee: 3D-Micromac AG, Chemnitz (DE)

( * ) Notice: Subject to any disclaimer, the term of this patent is extended or adjusted under 35 U.S.C. 154(b) by 97 days.

(21) Appl. No.: 17/590,313

(22) Filed: Feb. 1, 2022

(65) Prior Publication Data

US 2022/0216364 A1 Jul. 7, 2022

Related U.S. Application Data

(62) Division of application No. 16/495,913, filed as application No. PCT/EP2018/057192 on Mar. 21, 2018, now Pat. No. 11,245,052.

(30) Foreign Application Priority Data

Apr. 3, 2017 (DE) ...................... 10 2017 205 635.5

(51) Int. Cl.
*H01L 33/00* (2010.01)
*B32B 43/00* (2006.01)
(Continued)

(52) U.S. Cl.
CPC ........ *H01L 33/0093* (2020.05); *B32B 43/006* (2013.01); *H01L 21/67103* (2013.01);
(Continued)

(58) Field of Classification Search
CPC ............. H01L 33/0093; H01L 21/6838; B32B 43/006
See application file for complete search history.

(56) References Cited

U.S. PATENT DOCUMENTS 6,033,974 A 3/2000 Henley et al.
6,468,879 B1 10/2002 Lamure et al.
(Continued)

FOREIGN PATENT DOCUMENTS

EP 2 398 040 A1 12/2011
JP H07-240355 A 9/1995
(Continued)

OTHER PUBLICATIONS

Notice of Grounds for Rejection dated Sep. 13, 2022, of counterpart Korean Application No. 10-2019-7028939, along with an English translation.
(Continued)

*Primary Examiner* — Jay C Chang
*Assistant Examiner* — Mikka Liu
(74) *Attorney, Agent, or Firm* — DLA Piper LLP (US)

(57) ABSTRACT

A method of producing microelectronic components includes forming a functional layer system; applying a laminar carrier to the functional layer system; attaching a workpiece to a workpiece carrier; utilizing incident radiation of a laser beam is focused in a boundary region between a growth substrate and the functional layer system, and a bond between the growth substrate and the functional layer system in the boundary region is weakened or destroyed; separating a functional layer stack from the growth substrate, wherein a vacuum gripper having a sealing zone that circumferentially encloses an inner region is applied to the reverse side of the growth substrate, a negative pressure is generated in the inner region such that separation of the functional layer stack from the growth substrate is initiated
(Continued)

in the inner region; and the growth substrate held on the vacuum gripper is removed from the functional layer stack.

6 Claims, 6 Drawing Sheets

(51) Int. Cl.
    *H01L 21/67* (2006.01)
    *H01L 21/683* (2006.01)
    *H01L 21/66* (2006.01)

(52) U.S. Cl.
    CPC .... *H01L 21/67115* (2013.01); *H01L 21/6838* (2013.01); *H01L 22/12* (2013.01); *H01L 33/007* (2013.01); *B32B 2457/14* (2013.01)

(56) References Cited

U.S. PATENT DOCUMENTS

| | | |
|---|---|---|
| 2006/0211159 A1 | 9/2006 | Bruederl et al. |
| 2007/0155129 A1 | 7/2007 | Thallner |
| 2007/0175384 A1 | 8/2007 | Bruderl et al. |
| 2013/0273751 A1 | 10/2013 | Wang et al. |
| 2013/0280825 A1 | 10/2013 | Yoshitaka et al. |
| 2015/0279707 A1* | 10/2015 | Sim ................ H01L 21/6838 156/752 |
| 2016/0074960 A1 | 3/2016 | Hirata et al. |
| 2016/0336233 A1 | 11/2016 | Yonehara et al. |
| 2017/0062650 A1 | 3/2017 | Chen et al. |

FOREIGN PATENT DOCUMENTS

| | | |
|---|---|---|
| KR | 10-2009-0117986 A | 11/2009 |
| KR | 10-2014-0140053 A | 12/2014 |
| KR | 10-2016-0032678 A | 3/2016 |

OTHER PUBLICATIONS

Ralph Delmdahl, "Laser lift-off: Lower overall heights in the microphone electronics by substrate transfer," laser technology, 2013, pp. 54-56.

\* cited by examiner

Fig. 1
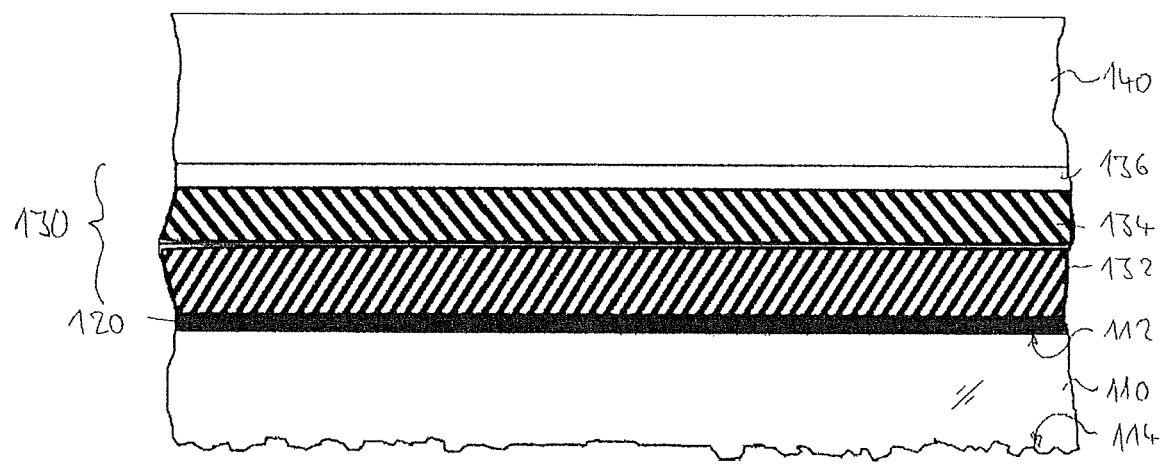
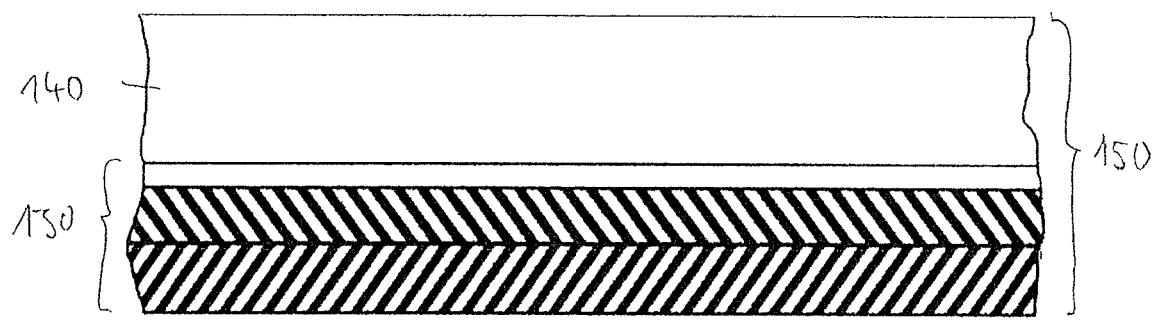
Fig. 2

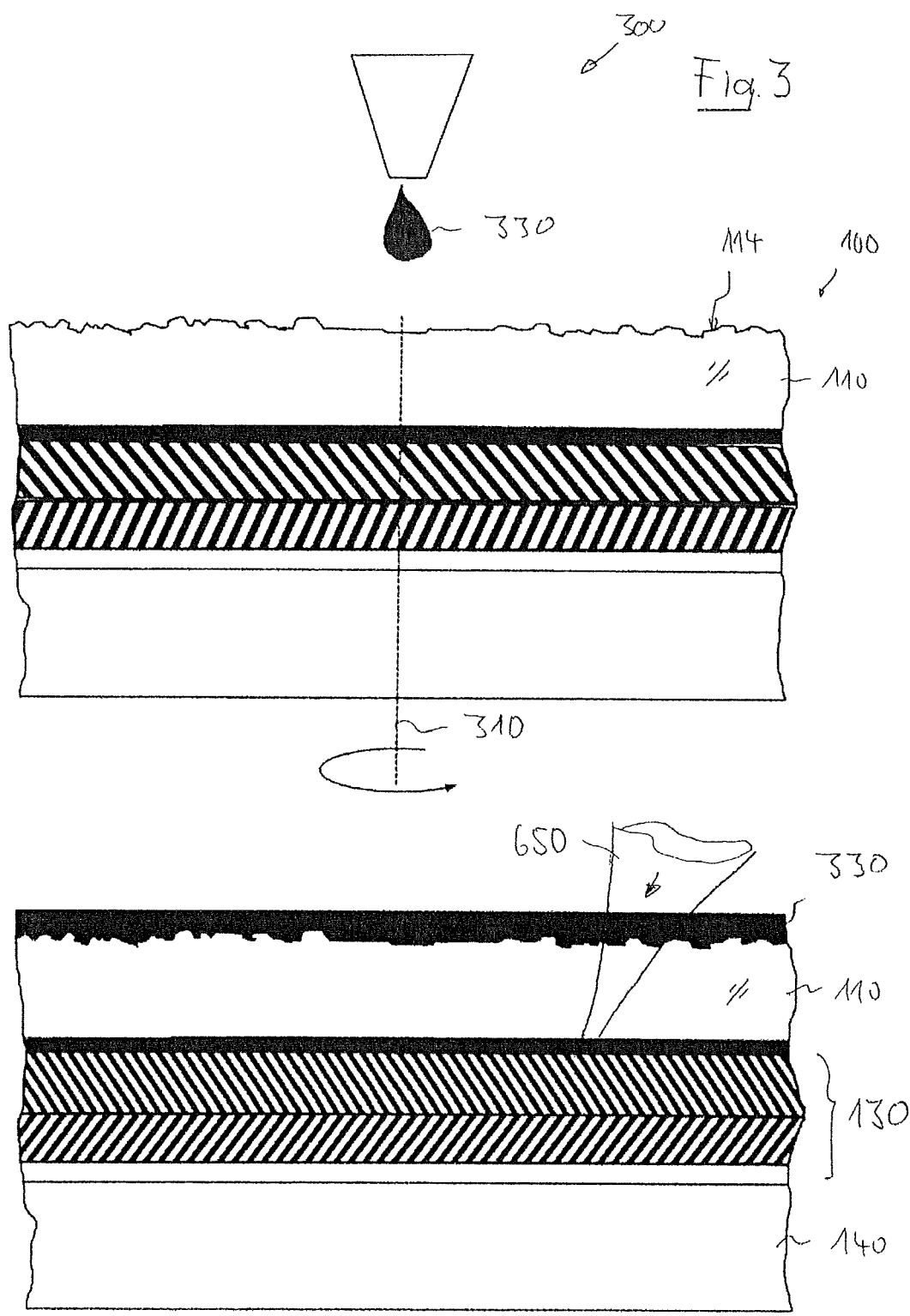

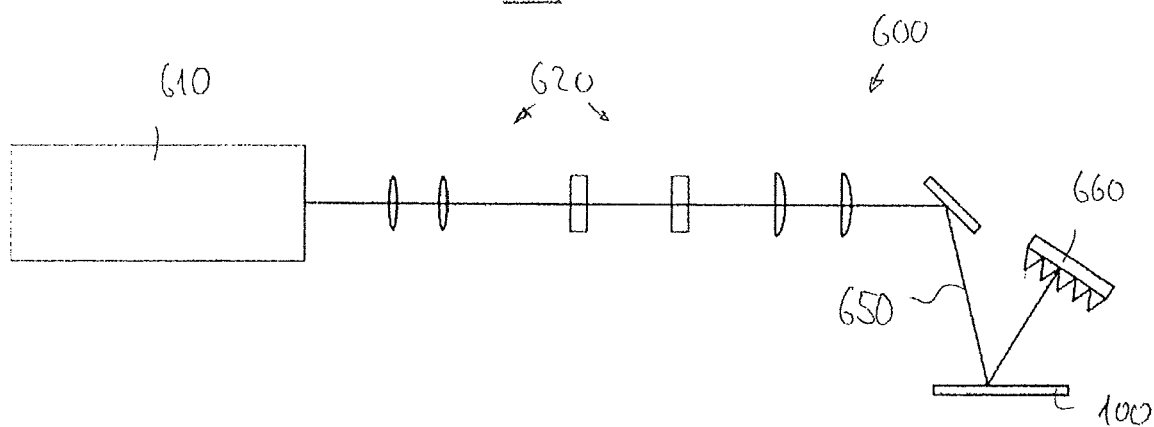
Fig. 6A
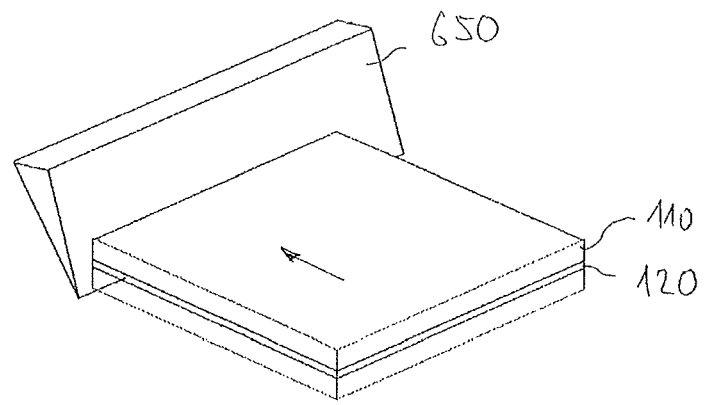
Fig. 6B
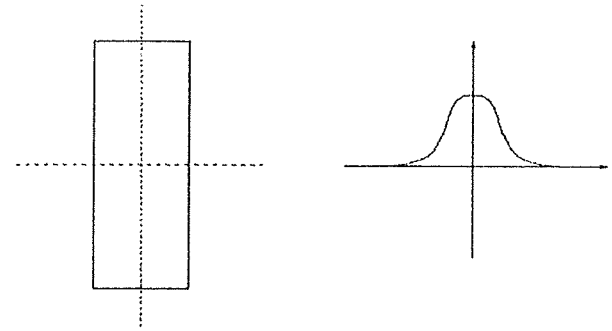
Fig. 6C
Fig. 6D
Fig. 6E

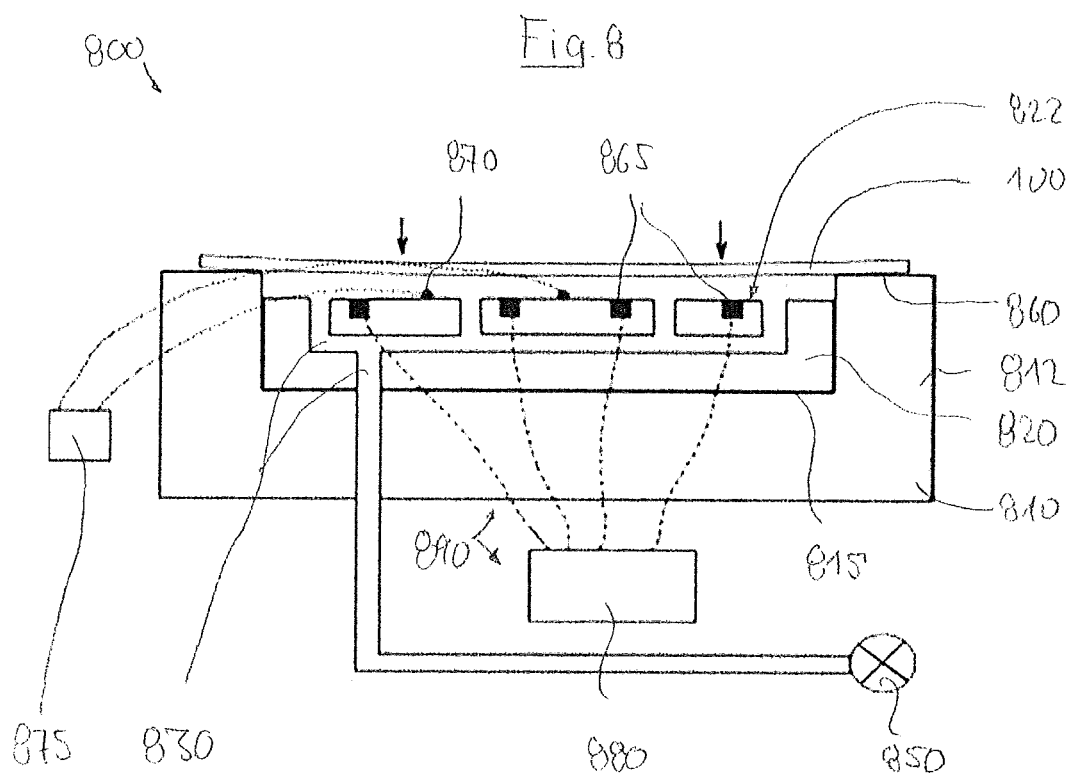
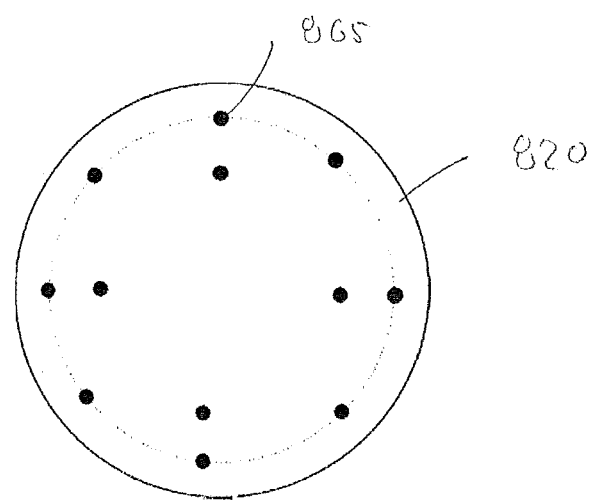

METHOD AND MANUFACTURING SYSTEM OF PRODUCING MICROELECTRONIC COMPONENTS WITH A LAYER STRUCTURE

TECHNICAL FIELD

This disclosure relates to a method of producing microelectronic components and an appropriate manufacturing system for the execution of the method.

BACKGROUND

In the production of microelectronic components such as, e.g., optoelectronic components, a common task involves the separation of a layer stack comprised of a plurality of layers between two specific layers such that two individual layer stacks are produced. Nowadays, for example, light-emitting diodes (LEDs) are frequently produced by the constitution of p- and n-doped semiconductor layers of gallium nitride (GaN) by epitaxial deposition on a sapphire wafer functioning as a growth substrate. Such layers have a respective thickness of a few m such that the overall thickness of the various GaN layers can, e.g., be less than 10 µm. Prior to further processing, structuring of the GaN layers can be executed, for example, by laser treatment for the production of individual components or in preparation for the production thereof. A thin, generally metallic bonding layer is applied to the GaN layer stack, for example, by vapor deposition. By this bonding layer, the growth substrate, with the GaN layer stack arranged thereupon, is bonded to a flat laminar carrier. The planar connection between the growth substrate and the GaN stack is subsequently released. As a result, the GaN stack is transferred to the carrier. The carrier, with the GaN stack arranged thereupon, serves as a basis for the production of the microelectronic component.

The separation of the functional layer stack that incorporates the carrier and the GaN layer stack, from the growth substrate is generally executed by the "laser lift-off" method. A buffer layer located in the boundary region between the growth substrate and the GaN layers is destroyed or removed by laser irradiation. Irradiation is executed from the reverse side of the growth substrate and directed through the latter, wherein the laser beam is focused on the buffer layer or the boundary region. Thereafter, the growth substrate can be separated from the other layers by the action of an external force.

A method of this type is described, e.g., in "Laser lift-off: smaller overall heights in microelectronics achieved by substrate transfer" by R. Delmdahl in *Photonik* 2(2013, pp 54 to 56).

However, problems may occasionally occur during the release from the growth substrate of the functional layer system which is bonded to the carrier. Operation of the microelectronic component may be impaired as a result.

It could therefore be helpful to provide a method and a manufacturing system of the generic type such that the separating step, by which the growth substrate serving as a temporary substrate is separated from the other layers, can be constituted in a more reliable and more non-destructive manner than previously.

SUMMARY

We provide a method of producing microelectronic components including a carrier and a microelectronic functional layer system applied to the carrier, the method including forming a functional layer system on a front side of a growth substrate; applying a laminar carrier to the functional layer system for constitution of a workpiece in the form of a layered composite comprised of the carrier, the functional layer system and the growth substrate; attaching the workpiece to a workpiece carrier such that a reverse side of the growth substrate arranged opposite a front side is accessible; utilizing incident radiation of a laser beam from the reverse side of the growth substrate through the growth substrate such that the laser beam is focused in a boundary region between the growth substrate and the functional layer system, and a bond between the growth substrate and the functional layer system in the boundary region is weakened or destroyed; separating a functional layer stack comprised of the carrier and the functional layer system from the growth substrate, wherein for separation of the functional layer stack from the growth substrate, a vacuum gripper having a sealing zone that circumferentially encloses an inner region is applied to the reverse side of the growth substrate, further to the applying, a negative pressure is generated in the inner region such that, by introduction of a separating force to the growth substrate, separation of the functional layer stack from the growth substrate is initiated in the inner region; and the growth substrate held on the vacuum gripper is removed from the functional layer stack that is held on the workpiece carrier.

We also provide a manufacturing system that produces microelectronic components that include a carrier and a microelectronic functional layer system applied to the carrier, the system including a workpiece carrier that accommodates a workpiece in the form of a layered composite including a carrier, a functional layer system bonded to the carrier, and a growth substrate bonded to the functional layer system; a laser treatment station for incident radiation of a laser beam from a reverse side of the growth substrate through the growth substrate such that the laser beam is focused in a boundary region between the growth substrate and the functional layer system, and a bond between the growth substrate and the functional layer system is weakened or destroyed in the boundary region; a debonding station that separates a functional layer stack including the carrier and the functional layer system from the growth substrate, wherein the debonding station includes a vacuum gripper having a sealing zone that circumferentially encloses an inner region, that can be applied to a reverse side of the growth substrate such that an inner region can be sealed from the exterior by the sealing zone and, in the inner region, a clearance is provided between the vacuum gripper and the workpiece, and devices that generate a negative pressure in the inner region are provided in the vacuum gripper which is applied to the workpiece.

BRIEF DESCRIPTION OF THE DRAWINGS

FIG. 1 shows a schematic sectional view of an example of a workpiece in the form of a layered composite, prior to laser treatment.

FIG. 2 shows the layers of the workpiece represented in FIG. 1 at a later process stage, further to the separation of the workpiece into two layer stacks by a laser lift-off method.

FIG. 3 shows the workpiece represented in FIG. 1, further to the turning of the workpiece, during the application of a fluid layer to the rough reverse side of a growth substrate by spin coating.

FIG. 4 shows the workpiece represented in FIG. 1, further to the application of the fluid layer, during a laser treatment operation.

FIGS. 6A-6E show the following: FIG. 6A is a schematic representation of a number of components of a laser treatment system in the laser treatment station, FIG. 6B is an oblique incident radiation of a line profile on the workpiece during the laser treatment operation, FIG. 6C is a schematic radiation profile (illuminated region) on the surface of the workpiece, FIG. 6D is an intensity profile of the laser beam perpendicularly to the longitudinal axis, and FIG. 6E is an intensity profile of the laser beam parallel to the longitudinal axis of the line profile.

FIG. 8 shows an example of a workpiece carrier with an integrated electrical heating device.

FIG. 9 shows the spatial distribution of electrical heating elements of the heating device represented in FIG. 8, in two concentric zones.

DETAILED DESCRIPTION

Figure 5:
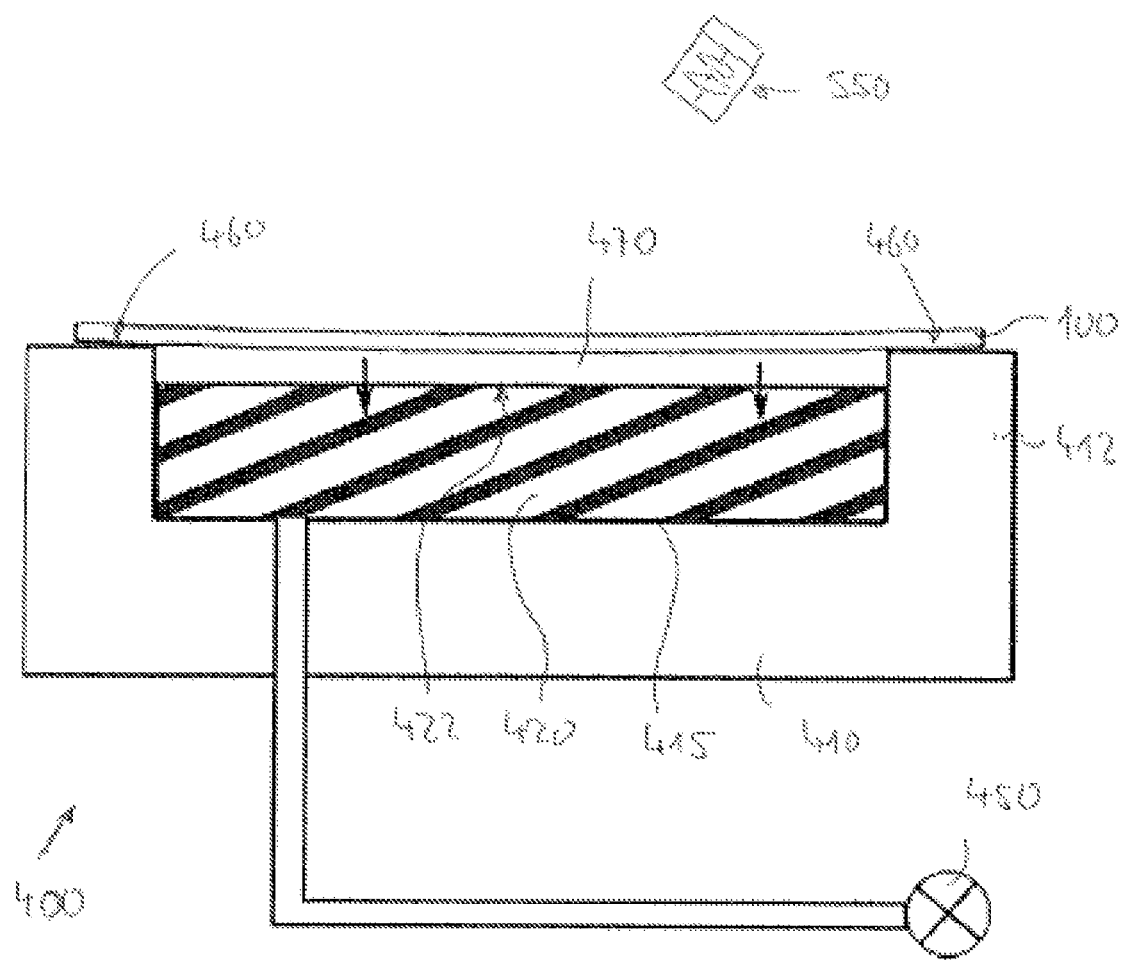
FIG. 5 shows a schematic representation of an example of a workpiece carrier for holding the workpiece during a laser treatment operation, in a subsequent laser treatment operation.

The method is employed for the production of microelectronic components comprising a carrier and a microelectronic functional layer system applied to the carrier. A functional layer system is constituted on a front side of a growth substrate. Thereafter, a laminar carrier is applied to the side of the functional layer system which is averted from the growth substrate such that a workpiece is constituted in the form of a layered composite comprised of the carrier, the functional layer system and the growth substrate, in the form of a layer stack. This workpiece is attached to a workpiece carrier such that the reverse side of the growth substrate, which is arranged opposite the front side, is accessible for subsequent laser treatment. During laser treatment, (at least) one laser beam is radiated from the reverse side of the growth substrate through the growth substrate such that the laser beam is focused in a boundary region between the growth substrate and the functional layer system, and a bond between the growth substrate and the functional layer system, which is initially still present, is weakened or destroyed in the boundary region. Thereafter, a functional layer stack comprised of the carrier and the functional layer system applied thereto, is separated from the growth substrate. A substrate transfer of the functional layer system thus occurs from the growth substrate to the carrier. By this method, the cost-effective production, specifically of semiconductor structures on increasingly large and increasingly sensitive carriers is possible.

A vacuum gripper is employed for the separation of the functional layer stack from the growth substrate, which is applied to the reverse side of the growth substrate such that a sealing zone circumferentially encloses an inner region. Further to application thereof, a negative pressure is generated in the inner region such that, by introduction of a separating force in the inner region, separation of the functional layer stack from the growth substrate is initiated. This is generally associated with formation of a curvature in the aspirated growth substrate, in the inner zone of the vacuum gripper which is enclosed on all sides by the sealing zone. Thereafter, the growth substrate which is held on the vacuum gripper can be removed from the functional layer stack which is held on the workpiece carrier.

Surprisingly, we found that, by this pneumatically-supported separation, the two thin elements that are to be mutually separated (the growth substrate and the functional layer stack) can be separated in a highly non-destructive manner, with no resulting damage to the functional layer system that might compromise operation of the latter. This is currently attributed to the fact that the separating forces required for separation, on the grounds of the negative pressure, engage with the entire surface of the growth substrate which lies within the negative pressure region in a highly uniform manner, with no localized force peaks such that, by surmounting adhesion forces, the growth substrate can be removed from the functional layer stack, which is held on the workpiece carrier, in a non-destructive manner. It is currently assumed that the separating forces initially effect a separation in the mid-region of the inner region which is enclosed by the sealing zone, which then progresses outwardly on all sides in the direction of the sealing zone.

The sealing zone can be circular, which can be advantageous, e.g., in workpieces in the form of circular multi-layered wafers. Other shapes of the circumferential sealing zone are also possible, e.g., an oval shape or a rectangular shape (optionally with rounded corner regions), or another polygonal shape. Rectangular shapes can be appropriate, e.g., in rectangular workpieces.

As a workpiece carrier, any workpiece carrier can be employed which ensures the non-destructive retention of the workpiece. For example, a vacuum tensioning device can be employed, which executes the large-surface aspiration of the workpiece carrier at a planar contact surface of the vacuum tensioning device. The workpiece carrier is preferably configured as a vacuum tensioning device, having a sealing zone that circumferentially encloses an inner region, wherein the workpiece can be applied to the workpiece carrier such that contact between the workpiece and the workpiece carrier is only established in the region of the sealing zone, wherein a negative pressure is then generated in the inner region. In this manner, by negative pressure, a counterforce to the separating force executed by the vacuum gripper can be generated such that the thin elements which are to be mutually separated are drawn apart from one another on both sides by negative pressure. Even more reliable separation of the elements which are to be separated is possible here.

In the laser treatment operation, in which a laser beam is to be successively focused over an entire surface to be separated in the relatively narrow boundary region between the growth substrate and the functional layer system, for various reasons, it can occur that the boundary region does not extend in a single plane, but assumes substantial local deviations from a reference plane. This can result, for example, in a curvature of the workpiece associated with the production process of the growth substrate and/or of the carrier, and/or in the generation of stresses during the coating of the functional layer system. Moreover, aspiration of the workpiece may possibly result in a curvature of varying magnitude in the workpiece. To counteract any resulting inaccuracies in the laser treatment operation, some configurations provide for the scanning of the surface profile of the workpiece which is held by the workpiece carrier, prior to irradiation and/or during irradiation by the laser beam to record shape data, wherein focus control of the laser beam during irradiation is executed with reference to the shape data. It can thus be ensured that the laser beam remains focused in the boundary region with sufficient accuracy throughout the entire irradiation process, even where the boundary region does not continuously lie in a single plane.

Scanning can be executed on a separate measuring station which is arranged up-circuit of the laser treatment station. It is also possible for the measuring system to be integrated in the laser treatment station such that measurement is executed immediately in advance of laser treatment, and optionally with a temporal overlap in respect of the latter, and the focal point is adjusted accordingly.

Scanning is preferably executed by a contactless method, for example, by white light interferometry or laser triangulation. A corresponding measuring system can be arranged up-circuit of the laser treatment station, or can be integrated in the laser treatment station.

In numerous process variants, growth substrates can be employed which are separated from a larger substrate material block by mechanical separation processes. For example, sapphire aids that are suitable for use as growth substrates are typically cut from a larger sapphire block using a saw. The surfaces thus obtained can be relatively rough. If laser radiation is passed through a rough surface of this type, scatter effects can result in an impairment of focusability and of radiation quality, and in a reduction of the laser capacity which is available for the purposes of treatment. In a preferred initial form, this is counteracted wherein, prior to irradiation by the laser beam, a fluid layer comprised of a fluid transparent to laser radiation is brought into contact with the reverse side of the growth substrate, and irradiation by the laser beam is executed through the fluid layer. Any smoothing of the reverse side of the growth substrate serving as an incident radiation surface, which is likewise possible, by polishing or any other method, can thus be omitted. One or more additional processing steps on the growth substrate can thus be economized as a result of which the entire process can be executed in a more timesaving and cost-effective manner.

In some variants of the method, the fluid can be applied by a spin-coating process, which permits an exceptionally rapid and uniform coating or wetting by a fluid layer of adequate thickness.

As a fluid, for example, commercially available immersion fluids comprised of aliphatic or alicyclic hydrocarbons, or other fluids such as water (optionally with additional wetting agents), ethanol, isopropanol or liquid polymers can be employed. At the laser wavelength employed, the difference between the refractive index of the fluid and that of the constituent material of the growth substrate should be as small as possible. If possible, this difference should not exceed 20%.

In some examples, to permit the laser irradiation of relatively large separating surfaces within a short processing time, if required, it is provided that an incident laser beam with a line profile is employed, and a relative transverse movement is executed between the laser beam and the workpiece, specifically perpendicularly to a longitudinal axis of the line profile. By this scanning method, the workpiece can optionally be irradiated over its entire width in a single pass executed in the scanning direction such that bonding in the region of the boundary layer is released thereafter, and separation can proceed. Other irradiation strategies, for example, involving a step-and-repeat method, are also possible.

Incident radiation of the laser beam perpendicularly, or substantially perpendicularly to the workpiece surface (the reverse side of the growth substrate, optionally wetted with a fluid) is possible. However, it has proven to be advantageous if the incident laser beam is oriented obliquely to the reverse side of the growth substrate, wherein, preferably, an angle between a surface normal of the reverse side and the direction of incidence is 5° to 10°. Potential problems associated with the reflection of laser energy back into the optical system of the laser treatment installation can be prevented accordingly. Reflected components of the laser beam are reflected in a region outside the lens of the laser treatment system, where they can be absorbed by appropriate radiation traps.

In principle, all process steps can be executed at ambient temperature, specifically at room temperature (typically of the order of about 20° C.). However, it can also be appropriate for one or more process steps to be thermally supported by the heat-up of the workpiece and/or the heat-up of components of the manufacturing system to temperatures substantially in excess of the ambient temperature. In some process variants, the workpiece which is secured to the workpiece carrier is heated to a temperature that exceeds the ambient temperature. The temperature can, e.g., be at least 50° C. For the protection of the workpiece, and optionally of components of the manufacturing system, it has been established as appropriate that the temperature should be limited to a maximum 150° C.

Although external heating, e.g., by infrared radiation can be provided, the workpiece is preferably heated by a heating device integrated in the workpiece carrier, e.g., a heating device with electrical heating elements. This heat-up is preferably executed in a contactless arrangement, specifically by thermal radiation and/or convection. The workpiece can thus be heated in a particularly non-destructive and, if required, uniform manner.

We further provide a manufacturing system that incorporates devices for executing the process steps of the method. A specific feature may be provided in that the debonding station, in which the separating step is executed (separation of the growth substrate from the functional layer stack), comprises a vacuum gripper having a sealing zone that circumferentially encloses an inner region, which can be applied to the reverse side of the growth substrate such that the inner region can be sealed from the exterior by the sealing zone and, in the inner region, a clearance is provided between the vacuum gripper and the workpiece, wherein devices that generate a negative pressure in the inner region are provided in the vacuum gripper which is applied to the workpiece.

Particularly effectively, the vacuum gripper cooperates with a workpiece carrier configured as a vacuum tensioning device and incorporates a sealing zone that circumferentially encloses an inner region, wherein the workpiece can be applied to the workpiece carrier such that contact with the workpiece carrier is only established in the region of the sealing zone, and a negative pressure can be generated in the inner region.

This can be achieved in a particularly favorable manner, wherein the workpiece carrier comprises a pot-shaped main body, having a recess which is surrounded by a raised edge. In the recess, an air-permeable body can be inserted which incorporates, e.g., an open pore structure and/or inner fluid ducts for the aspiration of air through the body.

In some examples, the workpiece carrier incorporates an integrated heating device for the heat-up of the workpiece which is carried by the workpiece carrier. By this arrangement, optionally, process steps can be thermally supported, e.g., vaporization of fluid from the workpiece surface after laser irradiation. Preferably, the heating device comprises at least one electrically-heatable and preferably metallic body having an open pore structure and/or fluid ducts, wherein the body is preferably insertable in the recess of a pot-shaped main body of the workpiece carrier.

A debonding station of this type can optionally be retrofitted to existing generic manufacturing systems.

Further advantages proceed from the following description of preferred examples that are described hereinafter with reference to the figures.

Various aspects of the method and manufacturing systems for the production of microelectronic components by application of a laser lift-off method are described hereinafter with reference to examples. The microelectronic components produced by the method generally comprise a relatively thin flat carrier, and a microelectronic functional layer system applied to the carrier.

FIG. 1 shows a schematic sectional view of a workpiece 100 in the form of a layered composite having an exemplary layered structure. The workpiece 100 is an intermediate product generated in the course of the method that, inter alia, undergoes a laser treatment process. FIG. 2 shows a later process stage, further to the separation of the workpiece into two layer stacks by a laser lift-off method.

The workpieces to be processed can be, for example, the wafer composites of the above-mentioned type for the production of LEDs, although other layered materials and sequences, and wafer materials, are also possible. Hereinafter, although the process is described with reference to LED production, the applicability is not limited to this example.

The workpiece 100 represented in FIG. 1 comprises a growth substrate 110 in the form of a flat sapphire wafer. On the front side 112 of the growth substrate, which is flat machined to a high degree of precision, p-doped and n-doped semiconductor layers 132, 134 of gallium nitride (GaN) are constituted by epitaxial deposition. In the boundary region to the growth substrate, a thin buffer layer 120 is constituted. The buffer layer can be a separate layer, e.g., of undoped GaN, or a thin sublayer of the first GaN layer. The GaN layers generally have a respective thickness of a few m such that the overall thickness of the various GaN layers can be, e.g., less than 10 µm. Before any further processing, structuring of the GaN layers can be executed, for example, by laser treatment, for production of individual components or in preparation for the production thereof.

A bonding layer 136, generally having a thickness of a few m, is applied to the GaN layer stack, for example, by vapor deposition. This bonding layer can be comprised, e.g., of gold, platinum, chromium or other metals. By this bonding layer, the growth substrate, with the GaN layer stack arranged thereupon, is bonded to a flat laminar carrier 140. Although, in this example, the carrier is constituted of a thin pane of glass, it can also be comprised of another material, e.g., of a semiconductor material such as, e.g., silicon. The bonding layer 136, together with the adjoining GaN layers, optionally with further layers, constitutes a functional layer system 130 that is essentially responsible for the functionality of the component to be produced and, in the finished component, is carried by the carrier or by an associated section of the carrier 140. The layered composite, together with the carrier 140 and the functional layer system 130, is described herein as a functional layer stack 150.

The sapphire wafers employed as growth substrates are generally cut from a larger sapphire block (sapphire ingot) using a saw. Sawing produces a high degree of surface roughness. The reverse side 114 of a sapphire growth substrate, e.g., can have an average surface roughness ($R_a$) up to the order of about 2 µm, and a roughness depth $R_z$ up to the order of about 20 µm. If a surface of this type is irradiated with a laser, a significant percentage of the incident laser power is lost by scatter associated with the surface roughness, and no longer available for the actual lift-off process. Moreover, radiation quality is significantly impaired as a result. This can lead to problems in the lift-off process.

To prevent this, the reverse side 114 of the growth substrate 110 can be smoothed by polishing. However, this means that, the production of the components, execution of one or even more additional process steps is required, thereby increasing the expense of the components in turn.

In an example, the rough reverse side 114 of the growth substrate is coated with a fluid 330 (FIG. 3) such that, in the subsequent laser treatment (FIG. 4), scatter of the laser beam on the rough surface of the reverse side 114 is prevented, or is reduced to a non-critical measure.

To this end, the workpiece 100, further to a turning operation such that the rough reverse side 114 of the growth substrate is upward-facing, is positioned on a spin coating device 300, and rotated about the perpendicular axis 310. The speed of rotation can be up to 5,000 revolutions per minute. At the same time, a fluid 330 is applied from a nozzle to the rough reverse side 114 of the growth substrate which, by the rotation thereof, is evenly distributed over the entire surface. Wetting of the reverse side 114 is executed such that the thickness of the fluid layer 330 (c.f. FIG. 4) is at least sufficiently great that any surface roughness is covered in its entirety. However, the film thickness can also be greater. In the example shown in FIG. 4, the film thickness of the fluid layer 330, e.g., is at least 10 m.

The fluid employed should have a refractive index close to the refractive index of the constituent material of the growth substrate 110. Ideally, both refractive indices are identical or virtually identical although, for physical reasons, this is not always possible. However, a refractive index that lies no more than approximately 20% below that of the growth substrate material will already deliver a significant reduction in radiation losses by scatter. For example, as a fluid 330 for the coating of a sapphire wafer (with a refractive index approximately in the range of n=1.7 to n=1.8), an immersion fluid with a refractive index of approximately n=1.5 can be employed, for example, commercially obtainable immersion fluids comprised of aliphatic and alicyclic hydrocarbons. Other possible fluids include water, ethanol, isopropanol or liquid polymers. Coating might also be executed by spraying of the wafer with the fluid, or immersion in a fluid bath.

After completion of coating, the wetted workpiece 100 is transferred to a workpiece carrier 400 of a laser treatment station 600 (c.f. FIG. 5). To this end, the workpiece, for example, together with a plurality of further coated workpieces, can be inserted into a cassette, from which the latter, e.g., by a robot, can be carried to the workpiece carrier. The fluid coating remains on the workpiece throughout.

The workpiece carrier 400 according to FIG. 5 is specifically adapted to the nature of the workpieces and the particular features of the manufacturing process. The workpiece carrier 400 is configured as a vacuum tensioning device (or vacuum chuck) to permit the non-destructive attachment of the workpiece to the workpiece carrier, optionally with no mechanical elements which engage with the workpiece. The workpiece carrier comprises a pot-shaped main body 410 that incorporates a recess 415 enclosed by a raised edge 412. A flat body 420 of an open pore material (such as, e.g., a sintered metal or an open pore ceramic) is accommodated in the recess of the main body.

The upward-facing surface 422 of the porous body is arranged deeper by a magnitude of approximately 25 µm-100 µm than the surrounding surface of the main body that is constituted, e.g., of the upper side of the circumferential edge 412. The wetted workpiece 100, with the underside thereof constituted of the carrier, is configured such that, at its edge region, it engages with the circumferential edge of the main body over the entire circumference thereof. In this processing position, the greatest proportion of the workpiece 100 is retained in a free-floating arrangement, with a clearance above the porous body 412. Between the underside of the workpiece and the porous surface, a corresponding interspace of, e.g., 25 µm-100 µm is provided.

By a pump 450 connected to a suction side of the porous body via lines, a negative pressure is generated in this interspace, by which the workpiece is suction-mounted onto the workpiece carrier (see arrows of force). Additionally, the workpiece can be attached to the main body by retaining clamps, although this is not generally necessary.

Where the workpiece 100 engages with the raised edge 412 of the main body, there is a circumferential sealing zone 460 enclosing an evacuable inner region 470. Contact between the workpiece 100 and the workpiece carrier 400 is only established in the region of the sealing zone. It can be sufficient if the edge region of the workpiece engages directly with the edge of the main body. Absolute airtightness in the contact region is not absolutely necessary. A circumferential elastic seal can be provided on the circumferential edge. In the inner region, a negative pressure can be generated by the pump 450. Depending upon the rigidity of the multi-layer workpiece, a slight curvature of the workpiece can be constituted in the interior of the recess.

Immediately ahead of a down-circuit laser irradiation stage, measurement of the curvature or the surface profile of the workpiece 100 on the workpiece carrier 400 is executed by a contactless measuring system 550, for example, using a white light interferometer or a laser triangulation sensor. Curvature of the workpiece can be caused, e.g., by formation of the substrates and/or can be generated by tensions arising during the coating process. Moreover, by the suction-mounting of the workpiece on the workpiece carrier, a slight curvature can also be generated since the workpiece is only engaged at the circumferential edge region, and not supported in the inner region. Curvature, which is quantified here as the difference between the maximum and minimum height of the measured profile, can, e.g., be up to 100 µm, but optionally can also be up to 1,000 µm. In one example, measurement of curvature is executed along a mid-line that spans the entire diameter of the workpiece. In this manner, a height profile along this line is retrieved. Shape data are thus obtained, which represent the surface profile of the workpiece which is to be treated thereafter by a laser beam. In the subsequent laser treatment, focusing of the incident laser beam can then be controlled in accordance with the shape data, and the surface profile can be tracked.

Thereafter, the workpiece is irradiated by a laser beam 650 in a laser treatment station during a laser treatment operation. A corresponding exemplary laser treatment system 600 is represented in FIG. 6A. In the example, the laser beam is generated by an excimer laser 610, and has a wavelength of 248 nm. However, other wavelengths, for example, 308 nm or 351 nm, are also possible. Wavelengths in the visible and near-infrared spectrum are also possible. The employment of another laser type such as, e.g., a diode-pumped solid state laser, is also possible. However, the wavelength must be selected such that both the growth substrate 110 and the fluid 330 employed as a coating are entirely or substantially transparent at this wavelength. Accordingly, the laser beam penetrates the fluid coating 330 and the growth substrate with no resulting reciprocal action, or only a limited reciprocal action, and is only absorbed in the buffer layer or the boundary region between the growth substrate 110 and the GaN functional layers (c.f. FIG. 4).

The laser beam that strikes the buffer layer 120 has an elongated linear profile (c.f. FIGS. 6B to 6E). Ideally, the longitudinal axis of the beam profile is sufficiently long such that the latter extends over the entire diameter of the workpiece. For example, for a sapphire wafer of diameter 6" (152.4 mm), a beam profile with a length of 155 mm or more, and a width in the region of 0.2 mm to 0.5 mm (e.g., approximately 0.33 mm), can be employed. Under these conditions, the energy density in the focal region can lie within the range of approximately 1,100-1,700 mJ/cm$^2$, which is sufficient for the weakening or destruction of the bond in the boundary region.

The requisite beam profile can be generated, e.g., by a homogenizing system 620 comprised of microlens arrays and cylindrical lenses. The laser beam is homogenized such that its intensity substantially remains virtually constant over the entire beam profile (FIG. 6E). It is also possible for the laser beam to be homogenized along the longitudinal axis of the line profile only, whereas, in the short axis perpendicularly thereto, the beam is not homogenized, but is only focused by a cylindrical lens. As a result, in the short axis, the beam assumes a Gaussian-type profile (FIG. 6B). Homogenization can be executed, e.g., wherein, by one or two parallel periodic arrangements of narrow cylindrical lenses (a few millimeters in width, and of length 155 mm or more), the raw beam is first split into a plurality of longitudinal sub-beams, which are then superimposed once more by a cylindrical lens, that functions as a condenser lens. In homogenization along both beam axes, two of the arrangements thus described are positioned in the beam path, the lenses of which, in their orientation, are mutually rotated through 90°. Alternatively, homogenization can be omitted, and the laser beam can be dispersed and collimated along the longitudinal axis by a telescope arrangement of cylindrical lenses.

As laser treatment progresses, the focal position of the laser line is corrected by the displacement of the line of focus or of the workpiece such that the buffer layer 120 within the layer stack which is to be irradiated, over the entire laser line, lies within the depth of field of the laser. The previously determined shape data from the up-circuit measurement stage are employed for this purpose.

In the example, the laser beam is directed onto the workpiece such that it strikes the workpiece surface at an angle of 5-10° from the perpendicular (c.f. FIGS. 6A and 6B). This prevents any reflection of the laser beam from the workpiece surface, or from the boundary surfaces within the workpiece, back into the optical system, as this might result in damage to optical components. For the capture of reflected radiation components, a radiation trap 660 is arranged in the vicinity of the workpiece such that the reflected component of the laser light strikes the latter and is absorbed therein. The radiation trap can comprise, e.g., an absorber of metal construction, e.g., of aluminum, which can be water-cooled and the shaping of which (for example, a periodic arrangement of spheres, pyramids or ribs) prevents any direct reflection of the beam.

In the laser treatment station according to the example, the workpiece is linearly fed below the stationary laser beam (c.f. FIG. 6B). A control unit is employed for the synchronization of the emission of the laser with the movement of the workpiece. To this end, a sensor system connected to the linear guide unit or integrated in the latter, at short time intervals or continuously, refers the travel executed by the linear guide to the control unit which, by a trigger unit connected to the laser, upon completion of a specified executed travel, triggers an individual laser pulse or a pulse train. The travel executed is selected such that the laser pulses applied to the surface of the workpiece partially overlap and, overall, the entire surface is thus irradiated in an uninterrupted manner. In the example described here, the interval is approximately 200-300 µm.

Optionally, prior to any further processing, the fluid layer can be removed from the sapphire substrate (growth substrate). This can be achieved, e.g., by aspiration of the fluid from the surface using a nozzle and a suction device, by surface blowing with a stream of air or an inert gas, flushing with a solvent (e.g., acetone), or vaporization of the fluid by the heat-up of the surface. However, further processing can also proceed without the removal of the fluid layer.

Figure 7:
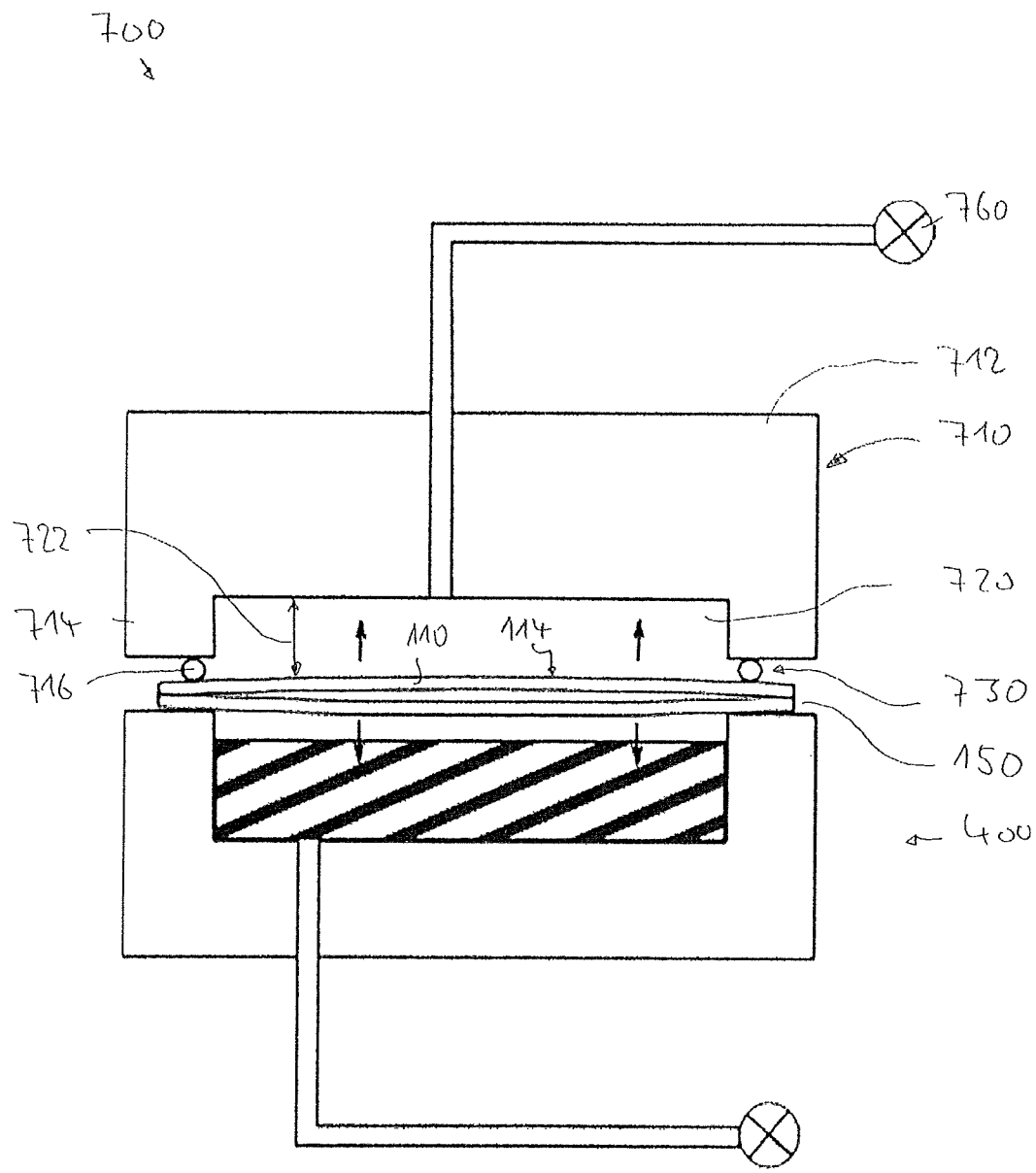
FIG. 7 shows an example of components of a debonding station, with a vacuum gripper for the removal of part of the workpiece from another part of the workpiece, which is held by the workpiece carrier, during a separating operation.

Although the buffer layer is destroyed by laser irradiation, the growth substrate 110 and the GaN layers continue to adhere to one another by the action of adhesion forces such that the action of an external force is required to achieve final separation. Active separation is thus required by the action of a force conducive to separation. To this end, the manufacturing system comprises a debonding station 700 arranged down-circuit of the laser treatment station. Elements thereof are schematically represented in FIG. 7.

Once the entire workpiece 100 has been irradiated, it is further transported by a linear guide system from the laser treatment station to the debonding station 700. The workpiece carrier 400 functions as a transport element, and there is thus no transfer of the workpiece to another workpiece carrier. However, transfer to a separate workpiece carrier would be possible. The debonding station comprises inter alia a vacuum gripper 710, having a sealing zone 730 that circumferentially encloses an inner region 720. The vacuum gripper is applied to the upper side of the workpiece, i.e., to the reverse side 114 of the growth substrate. The vacuum gripper is essentially comprised of a pot-shaped metallic main body 712 with a closed circumferential raised edge 714, and a circumferential seal 716 applied to the end face of the edge that can be comprised, e.g., of rubber or silicone.

Within the main body, one or more channels are configured, having openings within the inner region 720 enclosed by the seal or the sealing zone. A vacuum pump 760 that generates a negative pressure in the inner region connects to these channels. Alternatively, it is also possible, as in the workpiece carrier for the workpiece, to employ a body of a porous material incorporated in the main body, through the pores of which air is aspirated.

The circumferential seal 716 is fitted to the wafer composite (the workpiece 100) such that contact between the vacuum gripper 710 and the workpiece surface constituted of the reverse side 114 of the growth substrate is exclusively established via the seal, and an interspace is constituted in the inner region, which is enclosed by the seal, between the workpiece surface and the main body of the vacuum gripper. The height of the interspace or the clearance 722 between the workpiece surface and the main body of the vacuum gripper can be, e.g., 1 mm or more.

A negative pressure is generated in this interspace by the vacuum pump 760. As a result, the growth substrate is drawn upwards, and thus assumes a slight curvature or dish-shaped deformation. At the same time, the functional layer stack 150 comprising the carrier 140 and the functional layer system 130 which is applied thereto (thus, in this example, the carrier wafer with the GaN layers arranged thereupon), is also slightly deformed by the negative pressure applied to the workpiece carrier 400, and drawn downwards in the opposing direction. By these two mutually-opposing external forces, the growth substrate 110 is definitively separated from the functional layer stack 150 (the layered composite comprised of the carrier and the functional layer system) in a non-destructive manner. Separation is first initiated in the mid-region, at the greatest distance from the circumferential sealing zone, and then progresses outwardly on all sides.

In some examples, individual process steps can be usefully controlled by thermal support. For example, it may be required that the fluid employed by way of an auxiliary fluid for laser treatment is removed from the growth substrate in a non-destructive manner, by vaporization. A controllably heatable workpiece carrier can be employed for this purpose. To this end, FIG. 8 shows a schematic representation of an example of a workpiece carrier with an integrated electrical heating device 890. FIG. 9 shows the spatial distribution of electrical heating elements of the heating device.

The electrically heatable workpiece carrier 800 in FIG. 8 can be considered as a variant of the workpiece carrier 400 (FIG. 5). The workpiece carrier 800 configured as a vacuum tensioning device comprises a shallow, pot-shaped main body 810 having a recess 815 enclosed by a raised circumferential edge 812 which, in an overhead view, assumes a circular shape. A flat, disk-shaped body 820 is arranged in the recess in the form of a relatively flat metal plate in which a fluid channel system 830 is configured which comprises, at its underside, an opening provided for connection to the pump 850, and terminates in a plurality of apertures at the upper side of the metal plate. The upward-facing surface 822 of the flat body 820 is arranged approximately 25-100 µm below the upper side of the raised edge 812, which is enclosed by the sealing zone 860 in a circular arrangement. Where the flat workpiece 100 is applied to the workpiece carrier such that a substantially air-tight seal is formed along the circumferential sealing zone 860, a negative pressure can be generated by the pump 850 in the interspace between the underside of the workpiece and the flat body, that securely retains the workpiece on the workpiece carrier. The metal plate (the flat body 820) perforated by fluid channels is thus functionally similar to the open pore flat body 420 in the other example.

The integrated heating device 890 of the workpiece carrier incorporates heating elements 865 integrated in the metal plate and which, in the example represented, are inserted in corresponding recesses on the upper side of the metal plate facing the workpiece such that the upper sides thereof lie approximately flush to the upper side of the metal plate. Alternatively or additionally, heating elements can also be fitted in the interior of the flat body 820. It is understood that, in place of the metal body with integrated fluid channels, a good thermally-conductive open pore material with integrated heating elements can also be employed, for example, an open pore sintered metal.

The heating elements are preferably arranged in two or more concentric annular zones within the flat plate-type body 820. As shown in FIG. 9, e.g., a plurality of heating elements can be arranged at regular intervals along an inner ring, corresponding to heating zone 1, and further heating elements can be arranged along an outer ring of larger diameter (corresponding to heating zone 2).

In this example, the heating elements are electrical resistance heating elements. The heating elements heat up the metal plate by thermal conduction. If a good thermally-conductive material such as, e.g., copper or aluminum is employed for the flat body, relatively uniform heat distribution is achieved, in any event with flat maximum temperature profiles in the region of the heating elements. The temperature of the metal plate, i.e., of the flat body 820, is measured is this example by one or more temperature sensor(s) 870 which, in this example, are fitted to the upper side of the flat body facing the workpiece, in good thermal contact with the body. The temperature sensors, for example, in the form of thermocouples are connected to an associated measuring device 875, which communicates with the control device 880. By the control device 880, the power supply to the heating elements is adjusted with reference to the measured values from the temperature sensors such that the desired temperature of the metal plate is achieved, and maintained at the desired temperature level. In this example, the metal plate is heated to a maximum temperature of 150° C., as higher temperatures might damage the workpiece 100 to be processed. Although the workpiece does not directly engage with the metal plate (the flat body 820), and correspondingly assumes no mechanical contact with the heating elements either, thermal radiation and/or convection ensures the effective introduction of heat into the workpiece 100 such that the workpiece can be maintained at the desired temperature with a high degree of accuracy, to a margin of a few degrees Celsius. This is supported by the presence of only a small clearance, of significantly less than 1 mm between the heated upper side of the flat body and the facing underside of the workpiece 100.

By the method and the manufacturing system, e.g., LEDs or light-emitting diodes can be cost-effectively produced to a high quality standard. By the employment of other functional layer systems, and optionally other materials for the carrier and/or the growth substrate (e.g., glass), other components such as displays can also be produced.

The invention claimed is:

1. A manufacturing system that produces microelectronic components that comprise a carrier and a microelectronic functional layer system applied to the carrier, the system comprising:
    a workpiece carrier that accommodates a workpiece in the form of a layered composite comprising a carrier, a functional layer system bonded to the carrier, and a growth substrate bonded to the functional layer system;
    a laser treatment station for incident radiation of a laser beam from a reverse side of the growth substrate through said growth substrate such that the laser beam is focused in a boundary region between the growth substrate and the functional layer system, and a bond between the growth substrate and the functional layer system is weakened or destroyed in the boundary region;
    a debonding station that separates a functional layer stack comprising the carrier and the functional layer system from the growth substrate,
wherein
    the debonding station comprises a vacuum gripper comprising a raised edge that defines a sealing zone and circumferentially encloses an area including a recess, wherein the vacuum gripper is configured to be applied to a reverse side of the growth substrate such that the area can be sealed from the exterior by the sealing zone, in the area, a clearance is provided between the vacuum gripper and the workpiece, and the vacuum gripper is in contact with the growth substrate along the raised edge and not in contact with the substrate in the area including the recess, and
    devices that generate a negative pressure in the inner region are provided in the vacuum gripper which is applied to the workpiece.

2. The manufacturing system as claimed in claim 1, wherein the vacuum gripper further comprises a pot-shaped main body with a closed circumferential raised edge, and a circumferential seal of rubber or silicone is arranged on an end face of said edge.

3. The manufacturing system as claimed in claim 1, wherein the workpiece carrier is configured as a vacuum tensioning device having a sealing zone that circumferentially encloses an inner region, and the workpiece can be applied to the workpiece carrier such that contact with said workpiece carrier is only established in the region of the sealing zone and a negative pressure can be generated in the inner region.

4. The manufacturing system as claimed in claim 1, wherein the workpiece carrier comprises a pot-shaped main body, incorporating a recess enclosed by a raised edge.

5. The manufacturing system as claimed in claim 1, wherein the workpiece carrier incorporates an integrated heating device for the heat-up of the workpiece carried by the workpiece carrier.

6. The manufacturing system as claimed in claim 5, wherein the heating device comprises an electrically-heatable and metallic body having an open pore structure and/or fluid ducts, and said body is inserted in a recess of a pot-shaped main body of the workpiece carrier.

* * * * *